United States Patent
Roessig et al.

(10) Patent No.: US 12,418,239 B2
(45) Date of Patent: Sep. 16, 2025

(54) RECONFIGURABLE POWER CONVERTER HAVING MULTIPLE POWER STAGES

(71) Applicant: Empower Semiconductor, Inc., Milpitas, CA (US)

(72) Inventors: Trey Roessig, Oakland, CA (US); Parag Oak, Sunnyvale, CA (US); Shrinivasan Jaganathan, San Jose, CA (US); Narendra Gaddam, Milpitas, CA (US)

(73) Assignee: Empower Semiconductor, Inc., San Jose, CA (US)

(*) Notice: Subject to any disclaimer, the term of this patent is extended or adjusted under 35 U.S.C. 154(b) by 304 days.

(21) Appl. No.: 17/175,466

(22) Filed: Feb. 12, 2021

(65) Prior Publication Data
US 2021/0257909 A1  Aug. 19, 2021

Related U.S. Application Data

(60) Provisional application No. 62/977,075, filed on Feb. 14, 2020, provisional application No. 62/976,052, filed on Feb. 13, 2020.

(51) Int. Cl.
*H02M 3/157* (2006.01)
*G05F 1/10* (2006.01)
(Continued)

(52) U.S. Cl.
CPC .............. *H02M 3/157* (2013.01); *G05F 1/10* (2013.01); *H02J 1/10* (2013.01); *H02M 3/1584* (2013.01);
(Continued)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS 5,682,303 A * 10/1997 Goad ...................... H02J 1/102
363/40
6,362,607 B1 * 3/2002 Wickersham ....... H02M 3/1584
323/272
(Continued)

FOREIGN PATENT DOCUMENTS

CN  102761287 A  10/2012
CN  102835010 A  12/2012
(Continued)

OTHER PUBLICATIONS

International Application No. PCT/US2021/018065, International Search Report and Written Opinion mailed on Jul. 26, 2021, 9 pages.
(Continued)

*Primary Examiner* — Sean Kayes
*Assistant Examiner* — Nusrat Quddus
(74) *Attorney, Agent, or Firm* — FisherBroyles, LLP (57) ABSTRACT

A power conversion device includes: a semiconductor substrate; a plurality of controllers formed on the semiconductor substrate; two or more converter phases formed on the semiconductor substrate; two or more programmable components formed on the semiconductor substrate, each of the programmable components connected to a respective one of the two or more converter phases; and an interconnect circuit formed on the semiconductor substrate. The two or more programmable components are programmable to selectively couple the two or more converter phases to the plurality of controllers via the interconnect circuit.

29 Claims, 8 Drawing Sheets

(51) Int. Cl.
*H02J 1/10* (2006.01)
*H02M 3/158* (2006.01)
*H02M 3/335* (2006.01)
*H03K 17/16* (2006.01)

(52) U.S. Cl.
CPC ...... *H02M 3/33569* (2013.01); *H03K 17/165* (2013.01)

(58) Field of Classification Search
CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H05B 39/048; B23K 11/24; H04B 2215/069
See application file for complete search history.

(56) References Cited

U.S. PATENT DOCUMENTS

| | | | | |
|---|---|---|---|---|
| 7,609,040 | B1* | 10/2009 | Jain | H02M 3/1584 323/283 |
| 8,344,842 | B1* | 1/2013 | Luzanov | H01F 41/02 336/192 |
| 8,680,830 | B2* | 3/2014 | Kudo | H02M 3/158 323/283 |
| 9,780,663 | B2 | 10/2017 | Lidsky et al. | |
| 9,899,140 | B2 | 2/2018 | Kneller et al. | |
| 10,177,658 | B2 | 1/2019 | Labella et al. | |
| 10,504,848 | B1 | 12/2019 | Parto | |
| 10,505,456 | B1 | 12/2019 | Zhang et al. | |
| 10,707,753 | B2* | 7/2020 | Koski | G06F 1/266 |
| 2006/0279267 | A1* | 12/2006 | Burton | H02M 7/003 323/282 |
| 2007/0262132 | A1* | 11/2007 | Burton | G06F 1/26 235/375 |
| 2008/0002380 | A1 | 1/2008 | Hazucha et al. | |
| 2009/0108821 | A1* | 4/2009 | Standing | H02M 3/1584 323/272 |
| 2010/0199246 | A1* | 8/2010 | Huynh | G06F 30/392 716/118 |
| 2011/0004748 | A1* | 1/2011 | Carroll | G06F 1/3203 713/300 |
| 2011/0121808 | A1* | 5/2011 | Girdhar | H01L 27/088 257/E21.619 |
| 2011/0188218 | A1* | 8/2011 | Hsing | H01R 9/00 361/772 |
| 2012/0086416 | A1* | 4/2012 | Kudo | G06F 1/26 323/265 |
| 2015/0022533 | A1 | 1/2015 | Seminara et al. | |
| 2016/0124478 | A1* | 5/2016 | Beeston | G06F 1/26 713/300 |
| 2016/0254745 | A1* | 9/2016 | Lim | H01L 25/16 327/540 |
| 2019/0044436 | A1 | 2/2019 | Hijazi et al. | |
| 2019/0115053 | A1 | 4/2019 | Park et al. | |
| 2021/0120676 | A1* | 4/2021 | Clavette | H01L 23/5389 |
| 2022/0399810 | A1* | 12/2022 | Zhou | H02M 1/08 |
| 2023/0031911 | A1* | 2/2023 | Salus | G05F 1/56 |

FOREIGN PATENT DOCUMENTS

| | | | | |
|---|---|---|---|---|
| EP | 2634901 A1 * | 9/2013 | | H02M 3/1584 |
| EP | 2634902 A1 * | 9/2013 | | G06F 1/325 |
| EP | 3123937 A1 * | 2/2017 | | A61B 5/02416 |
| JP | 2012080744 | 4/2012 | | |
| JP | 2017055590 | 3/2017 | | |
| TW | 200425607 A | 11/2004 | | |
| TW | 201906293 A | 2/2019 | | |
| WO | WO-2005094523 A2 * | 10/2005 | | H02M 3/07 |
| WO | WO-2013127750 A2 * | 9/2013 | | G06F 1/325 |

OTHER PUBLICATIONS

Office Action issued in counterpart Taiwanese application No. TW110105412, mailed Nov. 3, 2021, 8 pages.
CN202180000617.1, "Office Action", Jun. 7, 2023, 7 pages.
TW111128532, "Office Action", Jan. 19, 2023, 9 pages.
TW111128532, "Office Action", Jun. 1, 2023, 3 pages.

* cited by examiner

RECONFIGURABLE POWER CONVERTER HAVING MULTIPLE POWER STAGES

CROSS-REFERENCE TO RELATED APPLICATIONS

This application claims the benefit of U.S. Provisional Application No. 62/976,052, filed Feb. 13, 2020, and U.S. Provisional Application No. 62/977,075, filed Feb. 14, 2020, the contents of both of which are hereby incorporated herein by reference in their entireties.

STATEMENT AS TO RIGHTS TO INVENTIONS MADE UNDER FEDERALLY SPONSORED RESEARCH OR DEVELOPMENT

This invention was made with Government support under contract number DE-AR0000908 awarded by DOE, Office of ARPA-E. The Government has certain rights in this invention.

BACKGROUND

Unless otherwise indicated herein, the materials described in this section are not prior art to the claims in this application and are not admitted to be prior art by inclusion in this section.

A DC-DC switching converter converts electrical power from a DC source to DC loads, such as processors or other load elements, while converting voltage and current characteristics. A multiphase switching converter includes a parallel set of power stages. In some cases, in order to provide sufficient power to different loads, multiple power stages may be combined in parallel to increase the supplied power and/or to provided power with improved electrical characteristics (e.g., better controlled output voltage). In such cases, the multistage power converters may be specifically designed for each application.

SUMMARY

Aspects of the present disclosure relate to power supplies, and more particularly, though not necessarily exclusively, to reconfigurable power converters.

In some embodiments a power conversion device comprises a semiconductor substrate and one or more controller circuits formed on the semiconductor substrate. Two or more converter phase circuits are formed on the semiconductor substrate and one or more programmable components are formed on the semiconductor substrate that are programmable to selectively couple any of the two or more converter phase circuits to any of the one or more controller circuits.

In some embodiments a power conversion device comprises a semiconductor substrate and one or more controller circuits that are formed on the semiconductor substrate. Two or more converter phase circuits are formed on the semiconductor substrate and a configurable circuit couples any of the one or more controller circuits to any of the two or more converter phase circuits.

According to various aspects there is provided a power conversion device. In some aspects, the power conversion device may include: a semiconductor substrate; a plurality of controllers formed on the semiconductor substrate; two or more converter phases formed on the semiconductor substrate; two or more programmable components formed on the semiconductor substrate, each of the programmable components connected to a respective one of the two or more converter phases; and an interconnect circuit formed on the semiconductor substrate. The two or more programmable components are programmable to selectively couple the two or more converter phases to the plurality of controllers via the interconnect circuit.

According to various aspects there is provided power conversion device. In some aspects, the power conversion device may include: controllers formed on a semiconductor substrate; and converter phases formed on the semiconductor substrate, the converter phases communicatively coupled to the controllers via programmable components. The programmable components are programmable to selectively couple the converter phases to the controllers.

According to various aspects there is provided power conversion device. In some aspects, the power conversion device may include: a semiconductor substrate; one or more controllers formed on the semiconductor substrate; a plurality of converter phases formed on the semiconductor substrate; and a configurable interconnect circuit that couples any of the one or more controllers to any of the plurality of converter phases.

BRIEF DESCRIPTION OF THE DRAWINGS

Various embodiments in accordance with the present disclosure will be described with reference to the drawings, in which.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Multiphase converters are used in many areas of computing from laptops and tablets to servers, mobile phones and Ethernet switches, as well as in other areas, to handle demanding power delivery requirements. A multiphase converter is a parallel set of power stages, each of which may include an inductor and one or more power switches. Some of the parallel power stages may be configured to deliver power to a load and may share an output capacitor. Varied load requirements, for example, different output voltages and/or output currents, may call for different combinations of power stages to supply the requisite power at an optimum efficiency. Aspects of the present disclosure can provide a reconfigurable power converter capable of providing the different combinations of power stages for varied load requirements. In some embodiments the power converter is configured at the device and/or package level via "hardwiring" and in other embodiments the power converter is configured via one or more programmable components that can either be static (e.g., fixed) or dynamic (e.g., can change based on the demands of the load) as described in more detail below.

Figure 1:
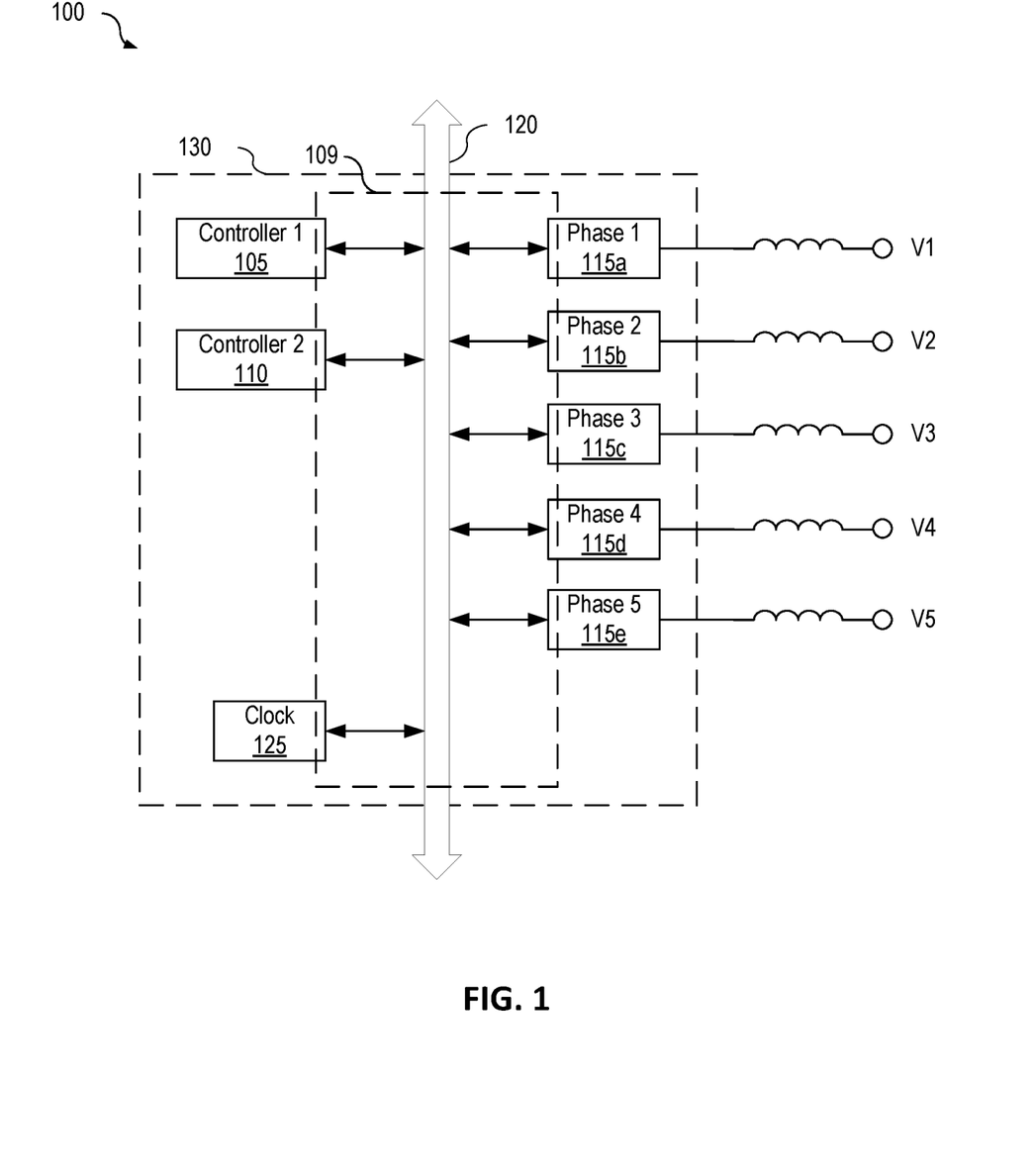
FIG. 1 is a simplified block diagram of a reconfigurable power converter according to some aspects of the present disclosure.

FIG. 1 is a simplified block diagram of a reconfigurable power converter 100 according to some aspects of the present disclosure. As shown in FIG. 1, the reconfigurable power converter 100 includes a first controller 105 and a second controller 110, each coupled to each of five converter circuits (also called "phases") 115a-115e via a communications bus 120, also referred to herein as a portion of a configurable circuit 109. In some embodiments configurable circuit 109 can couple any of phases 115a-115e to any of controllers 105, 110 and further can couple clock 125 to any of phases 115a-115e and to any of controllers 105, 110, as described in more detail below.

In some embodiments, configurable circuit 109 can include an interconnect circuit (e.g., individual electrical conductors) formed on the substrate and arranged to form electrical connections between any of the controller circuits and any of the two or more converter phase circuits. In one embodiment the configurable circuit 109 can include one or more electrical traces and or switches formed between controllers 105, 110, phases 115a-115e and/or clock 125. In some embodiments the configurable circuit 109 can be "hardwired" for example, using one or more metal layers formed on the semiconductor substrate, wirebonds formed across the semiconductor substrate and/or external electrical conductors formed in an electrical routing structure (e.g., circuit board, package substrate, leadframe, etc.). In other embodiments the configurable circuit 109 can be programmable using one or more programmable components that that configure the electrical connections formed by the interconnect circuit. That is, in some embodiments the programmable components can be switches, or can control one or more switches that couple any controllers 105, 110 to any phases 115a-115e and couple clock 125 to any of the controllers or any of the phases.

In some embodiments the one or more programmable components can comprise transistor-based switches such as, but not limited to a tri-state buffer. In further embodiments the one or more programmable components comprise a non-volatile memory and/or digital circuitry. In yet further embodiments the one or more programmable components comprise a fuse and/or one or more antifuses. In some embodiments the non-volatile memory may comprise fuses or antifuses.

In some embodiments a least one of the one or more programmable components is a portion of the one or more controller circuits. For example, in one embodiment controller circuits 105, 110 can each include a plurality of tri-state buffers that selectively couple controller 105 to phases 115a-115c and controller 110 to phases 115d and 115e so each respective phase receives control information from its respective controller. In another embodiment phases 115a-115e may each have a plurality of tri-state buffers that selectively couple each of the phases to a particular clock control line such that each phase receives an appropriately timed signal. That is, using the example above, phases 115a-115e could each be coupled to a separate clock control line so each phase triggers 120 degrees apart. Using this same example, when controller 105 sheds phase 115c due to a decrease load requirement, configurable circuit 109 can change the configuration of the tri-state buffer switches so that controller 105 is now coupled only to phases 115a and 115b. Similarly, clock 125 can now be selectively coupled to phases 115a and 115b which each receive PWM control signals from clock 125 180 degrees apart. Controller 105 can be programmed to have different operating modes based on how many phases it is controlling. For example, when controlling three phases the controller can have specifically programmed gains, set points, voltage thresholds, current thresholds and the like and when controlling two phases the controller can change any or all of the operating parameters.

In some embodiments one or more of the switches and/or programmable components can be positioned between controllers 105, 110 and phases 115a-115e. In one example, communications bus 120 may include a plurality of tri-state buffers that are programmable via the programmable components, such that the tri-state buffers are not a portion of the controller circuitry or the phase circuitry, but are positioned in-between these circuits. Thus, the interconnect circuit may include metal traces from each controller, clock and phase to a set of switches, and the set of switches can be operated via the programmable components to couple any controller to any phase and any clock to any controller and/or any phase. While FIG. 1 illustrates a reconfigurable power converter having five phases, a reconfigurable power converter may have more or fewer phases without departing from the scope of the present disclosure.

The standardized power conversion device 130 may be a semiconductor device that includes the first and second controllers 105, 110, respectively, timing circuitry 125, for example, clock circuits, oscillator circuits, or other timing circuits, and five phases 115a-115e that are each arranged to deliver power from an energy source (not shown) to one or more loads (not shown). Each phase may include, for example, but not limited to, one or more power switches (e.g., metal-oxide semiconductor field effect transistors (MOSFETs) or bipolar transistors), a pulse width modulator (PWM), as well as other circuitry. In some implementations, the PWM may be included in the controller (e.g., the first and second controllers 105, 110). The first and second controllers 105, 110, the timing circuitry 125 and the five phases 115a-115e may be formed on a unitary substrate.

In some implementations, the unitary substrate may be a unitary monolithic substrate. In some implementations, the first and second controllers 105, 110 and the timing circuitry 125 may be formed on one substrate and the five phases 115a-115e may be formed on a different substrate. Other configurations are possible without departing from the scope of the present disclosure. The communications bus 120 may be used to form electrical connections between each of the phases 115a-115e and one of the first and second controllers 105, 110, respectively, to configure the reconfigurable power converter 100 for various applications. Each of the first and second controllers 105, 110 may be programmed to control any or all of the five phases 115a-115e of reconfigurable power converter 100. In some configurations, the timing circuitry can be contained in one or more of the controllers or phase circuitries. In some configurations, no timing circuitry is utilized.

Figure 2A:
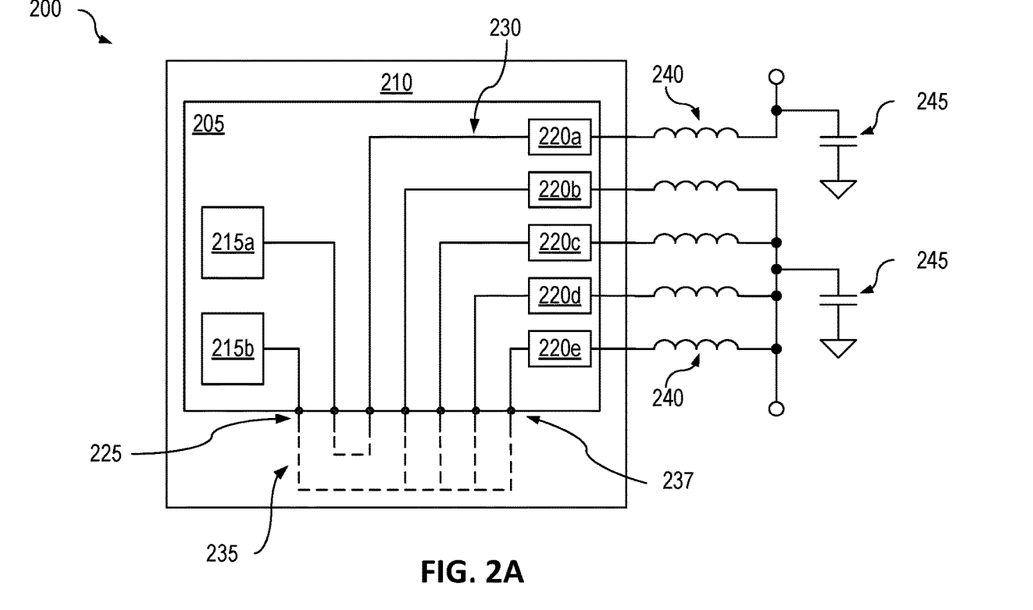
FIG. 2A is a simplified schematic illustrating an example of a reconfigurable power converter according to some aspects of the present disclosure.

For example, in one embodiment the first controller 105 may be configured to control the first phase 115a forming a single phase power converter and the second controller 110 may be configured to control the remaining phases 115b-115e forming a four phase power converter. In another example the first controller 105 may be configured to control the first and second phases 115a and 115b forming a two-phase power converter, and second controller 110 may be configured to control the remaining phases 115c-115e forming a three-phase power converter. Any combination of controllers and phases can be configured via configurable circuit 109. In some embodiments, a controller (e.g., controller 110) can dynamically vary the number of phases (e.g., phases 115c-115e) that are actively delivering power to the load so power conversion efficiency can be optimized.

In some embodiments, the communications bus 120 can be formed via hard wiring (on the substrate or via off-substrate components), programming of one or more components, multiplexing, a switch matrix, digital addressing, non-volatile memory such as fuses, or any other suitable method, as described in more detail below. Each phase 115a-115e can be a separate power converter circuit that includes a power input from a power source, one or more solid-state switches, switch driver circuits, diodes and other electronic components. In one example each phase 115a-115e is a synchronous buck converter. In some embodiments each phase 115a-115e may have a different power conversion capacity, operating voltage, current capacity, or other parameters. In one embodiment phase 115a is a low-power sleep mode phase that has a power delivery capability of 2 watts whereas phases 115b-115e each have a power delivery capability of 10 watts.

Figure 2B:
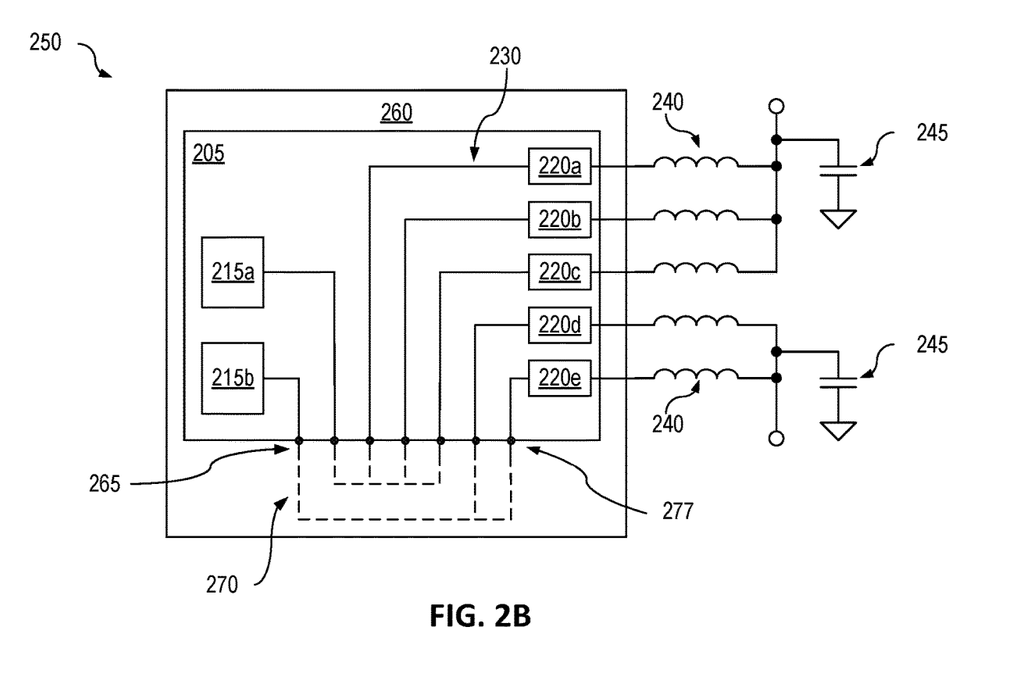
FIG. 2B is a simplified schematic illustrating another example of a reconfigurable power converter according to some aspects of the present disclosure.

FIG. 2A is a simplified schematic illustrating an example of a reconfigurable power converter 200 according to some aspects of the present disclosure. FIG. 2B is a simplified schematic illustrating another example of a reconfigurable power converter 250 according to some aspects of the present disclosure. Referring to FIGS. 2A and 2B, each of the reconfigurable power converters 200, 250 may include a standardized power conversion device 205. The standardized power conversion device 205 may be mounted within an electronic package 210, 260, respectively. The standardized power conversion device 205 may include two controllers 215a, 215b and five phases 220a-220e. Other implementations of the reconfigurable power converter may include two or more controllers and/or two or more phases.

A communications bus 225, 265, also referred to herein as an interconnect circuit, may couple each of controllers 215a, 215b to the phases 220a-220e. For example, as shown in FIGS. 2A and 2B, each controller 215a, 215b and each phase 220a-220e is configured with a communications line 230 that is accessible on the standardized power conversion device 205. Each electronic package 210, 260 may include circuitry that forms the dashed portions 235, 270 of each respective communications bus 225, 265. Because electronic package 210, 260 forms a portion of communications bus 225, 265, a standardized power conversion device 205 can be used and reconfigured, via different electronic packages, for different applications by configuring the dashed portions 235, 270, also referred to herein as an electrical routing structure, of communications bus 225, 265 within each electronic package. The electrical routing structure may be, for example, but not limited to, an in-package substrate (PCB or ceramic), a package leadframe, die-to-die wirebonds, die-to-die contacts (e.g., solder columns, balls or other contact structure), motherboard traces, or other construct that is not on the die containing the controllers and phases and is configured to couple a controller to a phase. The ability to configure the communications bus can enable any controller to be coupled to any phase, as described in more detail below. In some implementations, the communications bus (e.g., the interconnect circuit) may be formed entirely on a substrate of the semiconductor substrate as metalized conductors. In one example, wafers can be staged waiting a top layer of metal. After a customer orders a particular configuration of controllers and phases, the top layer of metal can be applied to configure the communications bus appropriately for that particular configuration. In further embodiments any layer or combination of layers in the semiconductor substrate can be used for form a portion of the communications bus.

Referring to FIG. 2A, the standardized power conversion device 205 may be utilized in power converter 200 to configure a one-phase and a four-phase power converter. The power converter 200 may include a first controller 215a coupled to first phase 220a and a second controller 215b coupled to the remaining four phases 220b-220e. The electrical connections 235 between the first controller 215a and the first phase 220a may be formed by electrical conductors, for example, but not limited to, printed circuit wiring within the electronic package 210 and/or top layer metallization of the semiconductor substrate. Similarly, the electrical connections 235 between the second controller 215b and the remaining four phases 220b-220e may be formed by electrical conductors, for example, but not limited to, printed circuit wiring and/or top layer metallization of the semiconductor substrate.

Referring to FIG. 2B, the standardized power conversion device 205 may be utilized in the power converter 250 to configure a three-phase and a two-phase power converter. The power converter 250 may include a first controller 215a coupled to three phases 220a-220c and a second controller 215b coupled to the remaining two phases 220d-220e. The electrical connections 270 between the first controller 215a and the three phases 220a-220c may be formed by electrical conductors, for example, but not limited to, printed circuit wiring of the electronic package 260 and/or top layer metallization of the semiconductor substrate. Similarly, the electrical connections 270 between the second controller 215b and the remaining two phases 220d-220e may be formed by electrical conductors, for example, but not limited to, printed circuit wiring of the electronic package 260 and/or top layer metallization of the semiconductor substrate.

As illustrated in FIGS. 2A and 2B, in some embodiment standardized power conversion device 205 is a semiconductor device that includes one or more controllers (e.g., first and second controllers 215a, 215b, respectively) and one or more phases (e.g., phases 220a-220e). More specifically, the semiconductor device can include the logic and control functions of controllers in addition to the power switches of each of the phases. Standardized power conversion device 205 can have a plurality of terminals 237, 277 that can be reconfigured in myriad ways to couple any of the controllers to any of the phases, as described in more detail below. In some embodiments terminals 237, 277 are electrically coupled together or to an external structure with wirebonds, solderballs (e.g., a flip-chip configuration), solder connections, conductive adhesive joints or any other electrically conductive structure.

In some embodiments, the different configurations of the controllers and power converter phases may be accomplished by different wiring within the electronic package 210 as compared to the electronic package 260. Each electronic package 210, 260 can include electrical conductors that may be reconfigured as a portion of the communications buses 225, 265. In some embodiments the different routing of the electrical conductors may be accomplished by changing circuit board traces in a substrate, leadframe or any other type of electrical routing structure that can be a component of a plastic electronic package such as a quad-flat no-lead (QFN) or ball-grid array (BGA) package. In other embodiments plurality of terminals 237, 277 can be routed out to a motherboard to which other electrical components are attached and the motherboard can couple any of the controllers to any of the phases. In yet further embodiments the different routing of the electrical conductors can be accomplished by changing one or more metallization layers formed on power conversion device 205.

Each of first and second controllers 215a, 215b may be programmed to control the appropriate phase(s) during device test and/or package test when the configuration of the power converter phases 220a-220e is changed, such as from FIG. 2A to FIG. 2B. In some implementations, each of first and second controllers 215a, 215b may poll the phases 220a-220e to automatically detect the number of phases coupled to each controller via reconfigurable bus 225, 265. Each of first and second controllers 215a, 215b may automatically configure themselves to control the number of phases to which they are coupled. In other embodiments each of first and second controllers 215a, 215b can be programmed via communications with an external device such as, for example, a microcontroller, a computer and/or one or more peripheral components (e.g., resistors, capacitors and the like) with particular values that are read by the controllers.

According to various aspects of the present disclosure, each phase 220a-220e can be configured with a different power converter, including but not limited to a DC to DC converter, an AC to DC converter, a DC to AC converter, or other converter architecture. In some implementations, the power conversion architectures may include, for example, but not limited to, buck converters, synchronous buck converters, boost converters, buck/boost converters, voltage-mode converters, a current-mode converters, a constant on-time converters, fixed frequency converters, or other conversion architectures. In some embodiments each phase can include a series of semiconductor switches connected in parallel as described in more detail in co-owned U.S. Pat. No. 9,300,210 and related continuations and divisionals, which are all incorporated herein by reference in their entirety for all purposes.

For example, referring to FIG. 2A, in one implementation, the first phase 220a may be configured as a low-power, highly efficient DC to DC power converter for supplying power to a central processing unit (CPU) during a sleep mode of the CPU. The remaining phases 220b-220e may be configured as a high-power, four-phase DC to DC power converter for supplying power to the CPU when it wakes up. In another implementation, two phases 220a-220b may form a two-phase converter and the remaining three phases 220c-220e may form a three-phase converter. In still another implementation, the first phase 220a may be configured as a boost converter that converts a 5 volt power source to a 24 volts power supply, and the remaining phases 220b-220e may be configured as a multiphase buck converter that converts the 5 volt power source to a 1.3 volt power source. Thus, a standardized power conversion device 205 can be utilized for various applications by packaging the standardized power conversion device 205 in different electronic packages 210, 260 that configure the appropriate connections of the communications bus 225, 265. The above examples are for illustration only and any parameters of controllers and/or phases can be programmed including but not limited to, output voltage, output current, maximum duty cycle, minimum duty cycle, over current and over voltage protection.

According to various aspects of the present disclosure, one or more of the first and second controllers 215a, 215b may be programmed to dynamically change the number of phases 220a-220e that are used as the load on the phases controlled by the controller varies. For example, referring again to the configuration shown in FIG. 2A, the second controller 215b controls three phases 220b-220e. In some cases, only one phase, for example phase 220b, may be needed to supply power to the load at an optimum efficiency. As the demands of the load increase, however, the second controller 215b may add additional phases 220c-220e as the load requires. The phases may be added one at a time or in combination based on the load requirements (e.g., output voltages and/or output currents, and efficiency of the power converter.

According to various aspects of the present disclosure, one or more phases that are coupled to a multiphase controller may be capable of providing different output powers. For example, referring again to FIG. 2A, the first phase 220a may be capable of supplying 500 milliamps, while the remaining four phases 220b-220e may each be capable of supplying 5 amps. In some implementations, the multiphase controller may account for the varied power delivery capability of each phase when determining which phases to activate during multi-phase operation.

As illustrated in FIGS. 2A and 2B, each communications bus 225, 265 was at least partially configured with electrical conductors that were included in the electronic packages 210, 260. According to various aspects of the present disclosure, the communications bus can be configured via programming of the controllers (e.g., the first and second controllers 215a, 215b) and/or each phase (e.g., the phases 220a-220e) of the reconfigurable power converter. For example, in some implementations, a digital communications bus (or any other type of communications bus) may be utilized. In such implementations, each controller responds only to signals corresponding to an address of a phase that is configured to communicate with the controller.

In some implementations, the communications bus 225, 265 bus may be an Inter-Integrated Circuit ($I^2C$) bus or other suitable communications bus. The communications bus 225, 265 may use standardized or proprietary communication protocols for communication between the controllers and the phases. In some implementations, the communications bus 225, 265 may be configured multiple times and formed via a switching multiplexer device, an array of transistor-based switches, or other suitable multiplexing architecture (not shown). In other embodiments the communications bus 225, 265 may be configured one time and formed via hardwiring, non-volatile memory such as fuses and/or antifuses, etc.

The communications bus 225, 265 may be a bidirectional bus with multiple parallel communications channels. The bidirectional bus may enable controllers and the phases to both transmit and receive communications. The bus may be digital, analog, or a combination of analog and digital signals. Each phase may send commands or requests to its respective controller providing the controller with information regarding that particular phase and/or the load requirements. For example, referring again to FIG. 2A, the first phase 220a may send a communications to the first controller 215a via a bidirectional bus, and phases 220b-220e may send communications to the second controller 215b via a bidirectional bus. In some implementations, each active phase may configured transmit a signal to a respective controller requesting the controller to add another phase when the active phase is close to, or exceeding a safe operating limit for supplying power to the load. In some embodiments in a similar manner, phases can be reduced (e.g., shed) when power requirements of the load are reduced, where the reduction may be prompted by the controller and/or the phases.

According to various aspects of the present disclosure, timing circuitry, for example, one or more clock circuits, oscillator circuits, or other timing circuits, may be used to synchronize the operation of each phase, and/or each controller. In some implementations, the controllers may configured to "enable" one or more phases to be active or to "disable" one or more phases. Each of the enabled phases may supply power to the load when initiated by a trigger signal and an appropriate timing signal is supplied. Disabled phases may not supply power to the load. The timing circuitry may be centralized or decentralized, as described in more detail below.

The electronic packages (e.g., the electronic packages 210, 260) may be any type or configuration of electronic package, including but not limited to a plastic ball-grid array (PBGA), quad flat no lead (QFN), small-outline integrated circuit (SOIC), chip-scale package (CSP), and a hybrid or variant thereof. In one example, the electronic packages 210, 260 may be PBGAs, and the dashed portions 235, 270 of the communications bus 225, 265 for each electronic packages 210, 260 may be formed via electrical traces formed in a printed circuit board (PCB) or other electrical routing structure. Thus, changing a configuration of the communications bus may include change the routing of one or more electrical traces within the PCB.

In another implementation, a configuration of the communications bus may be changed by changing a configuration of one or more wirebonds within an electronic package. More specifically, a "rerouting" of communications bus 225, 265 can be performed by changing wirebond connections within the electronic packages 210, 260 or by performing a trim function (e.g., with nonvolatile memory such as fuses, antifuses or other type of component) on standardized power conversion device 205. In further embodiments a "rerouting" of communications bus 225, 265 can be performed by changing one or more transistor-based switches or other logic circuitry (e.g., programmable components) that form portions of the communications bus. Other variants and alterations of electronic packages may be used to reconfigure the communications bus without departing from the scope of the present disclosure.

In some implementations, the output inductors 240 and/or the output capacitors 245 may be integrated within the electronic packages 210, 260. In some implementations, the output inductors 240 and/or the output capacitors 245 may be positioned adjacent the electronic package as discrete components on a circuit board to which the electronic packages are mounted. In some implementations, a reconfigurable capacitor bank can be used in conjunction with a reconfigurable power converter, as described in more detail below. In some implementations, one or more of the controllers and/or phases may be formed on separate semiconductor die. An example reconfigurable capacitor bank is disclosed in co-owned and co-pending application Ser. No. 17/085,514, the content of which is incorporated by reference herein in its entirety for all purposes.

It should be appreciated that aspects of the reconfigurable power converter have been described and shown as having two controllers and five phases for ease of explanation and understanding. Any number of controllers and any number of phases may be utilized for the reconfigurable power converter without departing from the scope of the present disclosure.

Figure 3:
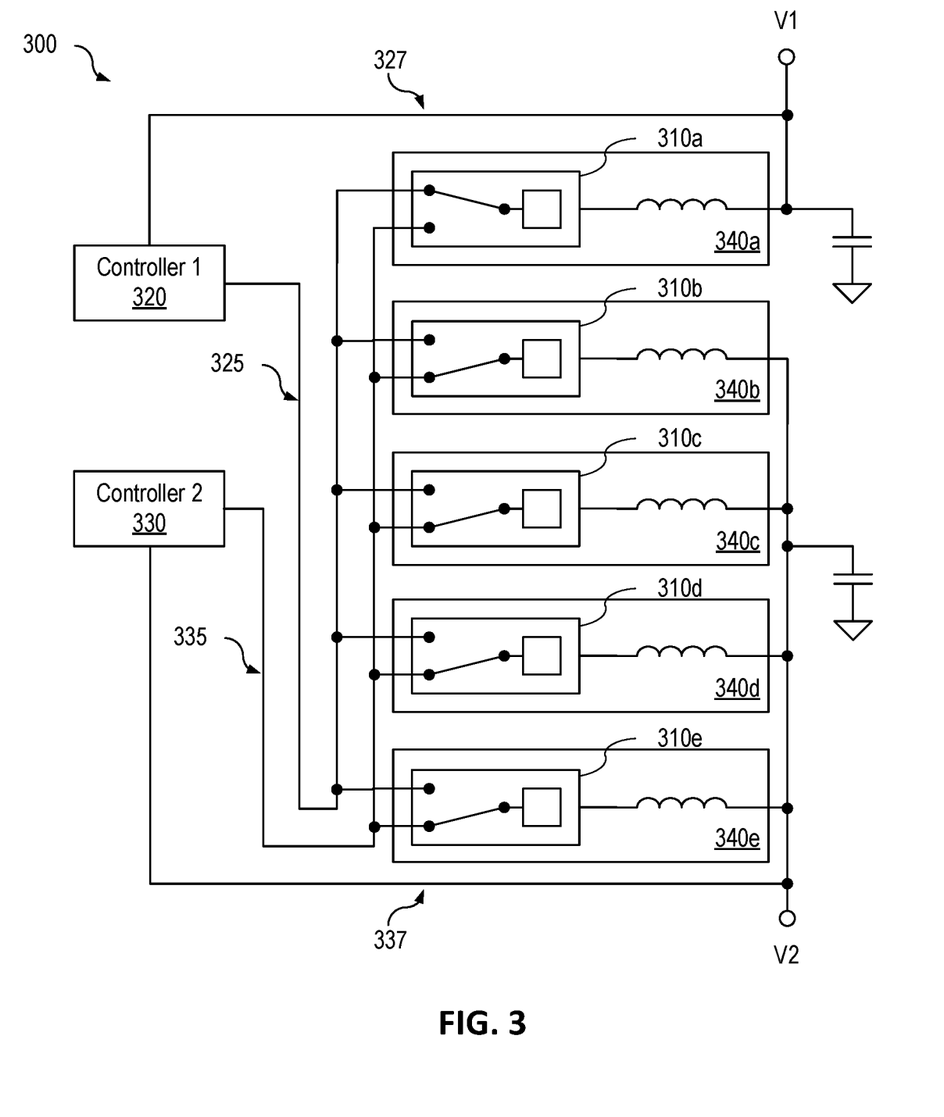
FIG. 3 is a simplified schematic illustrating an example of a communications bus according to some aspects of the present disclosure.

FIG. 3 is a simplified schematic illustrating an example of a communications bus 300 according to some aspects of the present disclosure. The communications bus 300 may be used in the reconfigurable power converters described with respect to FIGS. 1 and 2A-2B. As compared to FIGS. 2A and 2B which illustrated a communications bus implemented as a portion of an electronic package, the communications bus of FIG. 3 may be implemented with bus selection switches such as transistor-based switches, tri-state buffers, or other logic circuitry, other programmable components, trimming or hard-wiring, for example, using non-volatile memory such as fuses and/or anti-fuses, as described in more detail herein, that are positioned to control each phase, as described in more detail below. In some implementations, the programmable components may be positioned external to the phases while in other embodiments they may be positioned within the phases.

As shown in FIG. 3, a first controller 320 may be coupled to a first communications bus line 325 and a second controller 330 may be coupled to a second communications bus line 335. As described above, communications bus lines may also be referred to herein as interconnect circuits. Each communication bus line may include one or more physical signal lines. Each of the first communications bus line 325 and the second communications bus line 335 may be coupled to each phase 340a-340e. Each phase 340a-340e may include a bus selection switch 310a-310e (e.g., transistor-based switches, tri-state buffers, or other logic circuitry) or other feature (e.g., non-volatile memory such as fuse and/or anti-fuses, metal mask layers, metalized conductors, wirebonds, solder connections, etc.) that enables each phase to either be coupled to and commanded by the first controller 320 or the second controller 330, making the bus a configurable interconnect circuit. In the example illustrated in FIG. 3, the bus selection switch 310a in the first phase 340a is coupled to first bus line 325 and therefore may be controlled by instructions from the first controller 320. Similarly, the bus selection switches 310b-310e for the third through fifth phases 340b-340e, respectively, are coupled to the second bus line 335 and therefore may be controlled by instructions from the second controller 330. Thus, by changing a state of the bus selection switches 310a-310e, the first and second controllers 320, 330 may be coupled to any of the phases 340a-340e. In some embodiments the configurable interconnect circuit can be at least partially positioned within the controllers and one or more programmable switches within the controllers can couple any of the phases to any of the controllers. In various embodiments the configurable interconnect circuit can be at least partially positioned within the phases and one or more programmable switches within the phases can couple any of the phases to any of the controllers.

In one example, the first and second controllers 320, 330 can control operation of the phases 340a-340e using one or more analog control signals. The analog signals may directly control the output current of the phases. A controller may cause a phase to generate an output current proportional to the analog signal received by the controller. For example, the controller may cause the phase to generate an output current that is a constant times a value of the analog control signal. In some implementations, output currents may be balanced between phases by each phase tuning its proportionality constant, or by the controllers otherwise modifying a control signal to the phases.

As shown in FIG. 3, the first controller 320 may generate a voltage on the first bus line 325. As the voltage on first bus line 325 falls below a threshold voltage, the first phase 340a may respond by decreasing its output power. Conversely when the first controller 320 causes the voltage on the first bus line 325 to reach the threshold voltage, the first phase 340a may respond by increasing its output power. Similar control methodologies may be implemented, for example, using a current that increases or decreases corresponding to the load requirements.

In the embodiment illustrated in FIG. 3, the bus selection switches 310a-310e may be located in each of the phases 340a-340e. In some implementations, the bus selection switches may be located in the first and second controllers 320, 330, or in a multiplexer device (not shown) that may be communicatively coupled between the first and second controllers 320, 330 and the phases 340a-340e. In some implementations, the bus selection switches may be set and/or programmed into each phase 340a-340e via digital communications, fuses, and/or antifuses during test and/or assembly into an electronic package. In another implementation, the bus selection switches may be set by forming wirebonds between appropriate connections within the electronic package during assembly of power conversion device into electronic package, thereby effectively hardwiring the position of each switch.

While FIG. 3 illustrates bus selection switches 310a-310e as switch components (e.g., transistor-based switches), other programmable components, for example, but not limited to, fusible links, antifuses, etc. may be used without departing from the scope of the present disclosure. In further embodiments any type configurable hardwiring can be used to couple any controller to any converter phase, including but not limited to metal layers of the substrate, wirebonds, external circuit board traces, solder interconnects, etc.

FIG. 3 also illustrates a first feedback line 327 coupled to the first controller 320 to sense a first load voltage V1, and a second feedback line 337 coupled to the second controller 330 to sense a second load voltage V2. The first and second controllers 320, 330 may use the sensed load voltages to determine a state of each load (e.g., a load voltage higher or lower than a specified voltage). Based on the sensed load voltage, the controllers may determine appropriate control signals and transmit the control signals to one or more phases 340a-340e to regulate power delivered to the first and second loads.

Figure 4:
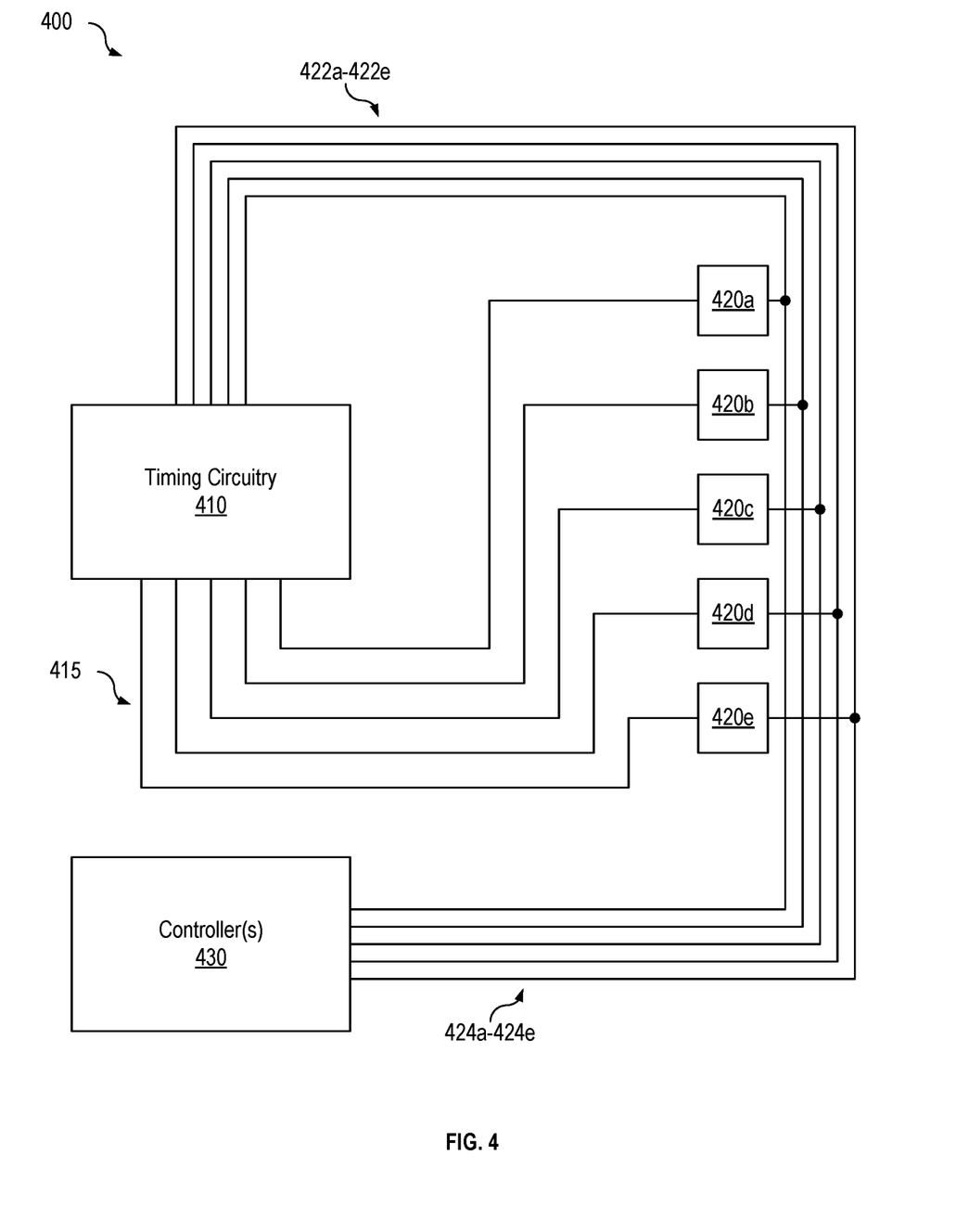
FIG. 4 is a block diagram illustrating an example of timing circuitry for a reconfigurable power converter according to some aspects of the present disclosure.

FIG. 4 is a block diagram illustrating an example of timing circuit 400 for a reconfigurable power converter according to some aspects of the present disclosure. Referring to FIG. 4, timing circuitry 410 may be coupled to each phase 420a-420e of a reconfigurable power converter (e.g., the reconfigurable power converter 100) via a clock bus 415.

In some implementations, the timing circuitry 410 may be implemented as circuitry external to the controller. In the example illustrated in FIG. 4, the clock bus 415 includes one conductor per phase 420a-420e. In some implementations, the clock bus may include a single conductor that is multiplexed to each of the phase 420a-420e, or the clock bus may include multiple conductors per phase. As described above, in some implementations, the controllers may "enable" or "disable" each phase of the reconfigurable power converter. The timing circuit 400 may generate trigger signals that may cause each enabled phase to initiate a switching cycle (e.g., deliver power to the load), as described in more detail below. In some implementations, the timing circuitry 410 may be implemented by a controller.

In some implementations, the timing circuit 400 may be coupled to the phases and/or the controller(s) via programmable components, for example, but not limited to, programmable switches (e.g., transistor-based switches, tri-state buffers, or other logic circuitry), non-volatile memory such as fuse and/or anti-fuses, etc. In further embodiments any type hardwiring can be used to perform the coupling, including but not limited to, metal layers of the substrate, wirebonds, external circuit board traces, solder interconnects, etc.

In some implementations, the controllers (e.g., the controllers 320, 330) may sense power delivered to the load from voltage feedback signal lines (e.g., feedback lines 327, 337), and may use the sensed feedback information to enable and/or disable phases. In some implementations, current feedback signal lines 422a-422e, 424a-424e may alternatively or additionally be provided for each phase by sensing current, for example, output current, current in the inductor, current in a resistor in series with the inductor, etc. The current feedback signals 422a-422e, 424a-424e may be provided to the controllers 430, to the timing circuitry 410, or to both. Each controller can transmit "enable" and "disable" commands to each phase it controls to meet load requirements (e.g., output voltage and/or output current). As described above each controller may be programmed to identify the phases that it controls and/or the capabilities of each phase when different phases have different power output capabilities). Each "enabled" phase may provide a signal to the timing circuitry 400 indicating that the phase is enabled.

The timing circuit 400 may determine the number of enabled phases and may generate timing signals for each phase. For example, for four enabled phases, the timing signal may trigger one phase of the four phases to execute a switching cycle at substantially regular spacing, for example, every 90 degrees. The timing signal may continue to generate trigger signals for each of the four phases until the phase requirements are changed, for example, by the controller. In various embodiments the controller may command the circuit to shed a phase and the timing circuitry may trigger one phase of the three phases to execute a switching cycle at substantially regular spacing, for example, every 120 degrees. In some embodiments the clock circuit can divide and send right edges of a timing signal to each active phase. The controller can send a signal to control the output of each phase (e.g., analog or digital) indicating a desired current or voltage output of each phase. Each phase can be controlled by turning on with a right edge of a timing signal and turning off with a left edge of the timing signal, where the left edge utilizes information from the controller to control the pulse width of the phase.

In some implementations, the controllers can actively change the number of active phases by "disabling" a previously "enabled" phase. In response, the newly disabled phase may cease sending an "enabled" signal to the timing circuit 400. The timing circuit 400 may determine the new number of phases and adjust the trigger signals accordingly. For example, if one phase of the four phases is disabled, the timing circuit 400 may send timing signals to the three enabled phases at substantially regular spacing, for example, every 120 degrees. This dynamic phase adjustment may be performed while the reconfigurable power converter continuously supplies power to one or more loads.

In some implementations, the timing circuit 400 may be configured to generate timing signals for a plurality of controllers. The timing circuit 400 may synchronize the timing signals between each controller, for example to minimize noise and/or adverse excitation of a power source. In some implementations, the timing circuit 400 may be coupled to each controller. The timing circuit 400 may determine from the controller which phases are enabled and which phases are disabled, rather than or in addition to receiving that information from each phase. In some implementation, the controllers and/or the timing circuitry may be programmed to control the phases by inputting digital codes.

Figure 5:
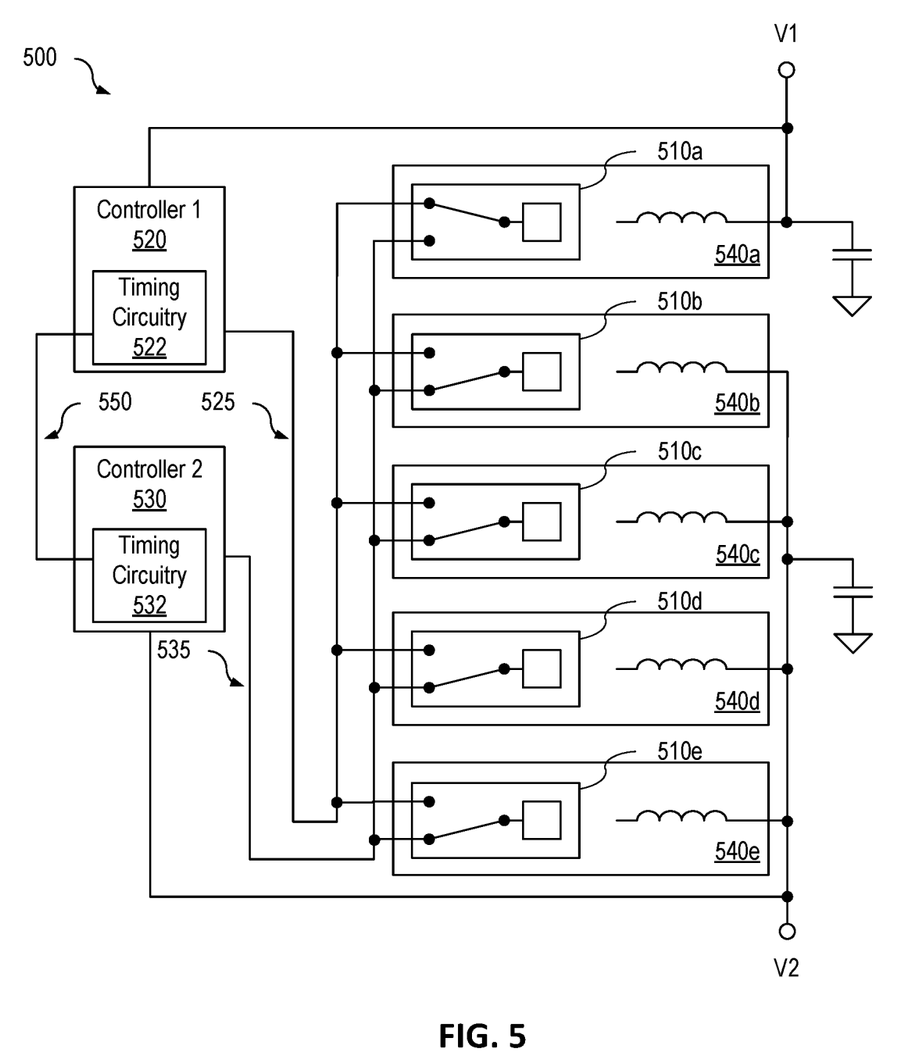
FIG. 5 is a simplified schematic diagram illustrating a reconfigurable power converter including decentralized timing circuitry according to some aspects of the present disclosure.

FIG. 5 is a simplified schematic diagram illustrating a reconfigurable power converter 500 including decentralized timing circuitry according to some aspects of the present disclosure. Referring to FIG. 5, each controller 520, 530 may have separate timing circuitry 522, 532 as compared to the centralized timing circuit 400 for all controllers, as illustrated in FIG. 4. As illustrated in FIG. 5, a first controller 520 may include first timing circuitry 522, and a second controller 530 may include second timing circuitry 532. The first timing circuitry 522 may be coupled to a first clock bus 525 and the second timing circuitry 532 may be coupled to a second clock bus 535.

Each phase 540a-540e may be coupled to the first clock bus 525 or the second clock bus 535 via respective programmable clock bus selection switches 510a-510e (e.g., transistor-based switches, tri-state buffers, or other logic circuitry) or other configurable components (e.g., non-volatile memory such as fuse and/or anti-fuses, metal mask layers, metalized conductors, etc.). The clock bus selection switches 510a-510e may operate similarly to the bus selection switches (e.g., the bus selection switches 310a-310e) described with respect to FIG. 3. Thus, each phase 540a-540e may be selectively coupled to particular timing circuitry from which it receives signals to execute a switching cycle. In some implementations, a timing coordination bus 550 may be coupled between the first timing circuitry 522 and the second timing circuitry 532 to enable timing coordination between first controller 520 and the second controller 530. In some embodiments timing circuitry 522, 532, clock bus 535 and selection switches 510a-510e can be formed on a unitary semiconductor device along with controllers 520, 530 and phases 510a-540e.

In some implementations, the configurations of the controllers and timing circuitry may be accomplished by means external to the power converter. For example, an external component, for example, a resistor or capacitor or other component or combination of components coupled to the power converter may cause the power converter to configure the connections of the controllers and configure the connections of the controllers and timing circuits. The controller can be programmed to recognize specific component values, or combinations of values, and in response change a set of switches to configure a communications and/or clock bus so specific phases are coupled to specific controllers. In some implementations, a digital code may be input to the power converter to configure the communications and/or clock busses.

While FIG. 5 illustrates bus selection switches 510a-510e as switch components (e.g., transistor-based switches), other components, for example, but not limited to, logic circuitry, non-volatile memory such as fuse and/or anti-fuses, metal mask layers, metalized conductors, etc. without departing from the scope of the present disclosure.

Figure 6A:
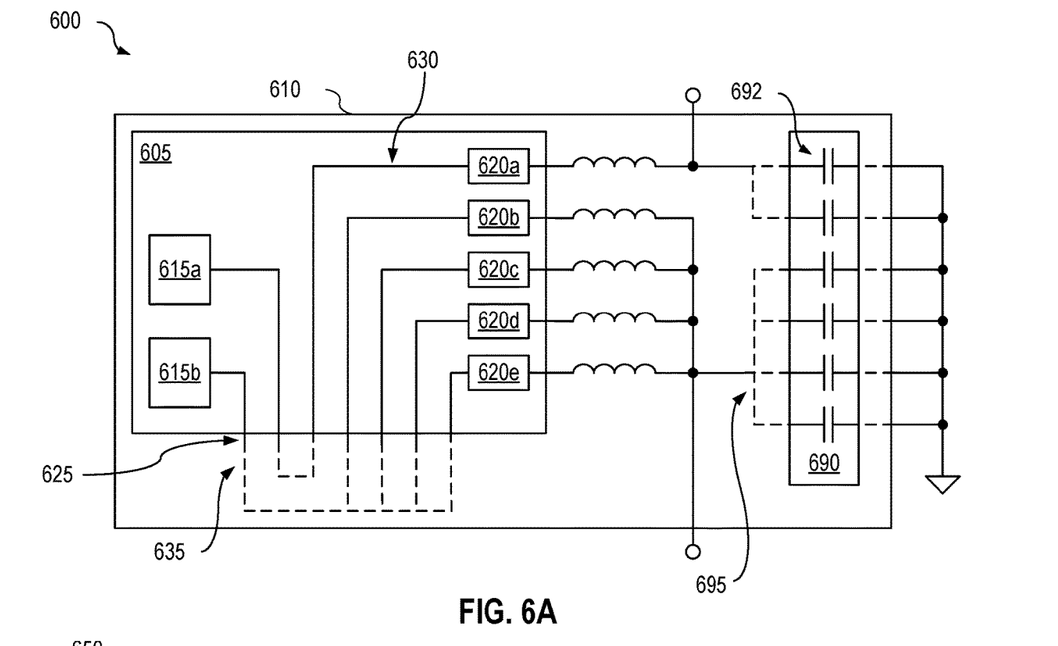
FIG. 6A is a simplified schematic illustrating an example of a reconfigurable power converter including integrated reconfigurable capacitors according to some aspects of the present disclosure.
Figure 6B:
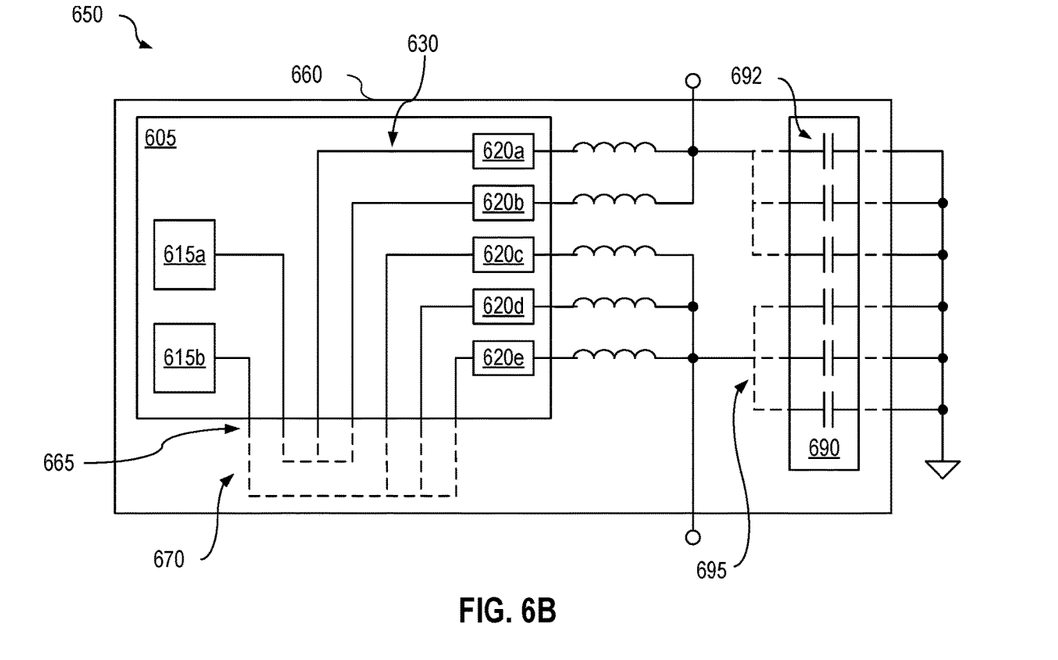
FIG. 6B is a simplified schematic illustrating another example of a reconfigurable power converter including integrated reconfigurable capacitors according to some aspects of the present disclosure.

FIG. 6A is a simplified schematic illustrating an example of a reconfigurable power converter 600 including integrated reconfigurable capacitors 690 according to some aspects of the present disclosure. FIG. 6B is a simplified schematic illustrating another example of a reconfigurable power converter 650 including integrated reconfigurable capacitors 690 according to some aspects of the present disclosure.

Referring to FIGS. 6A and 6B, each of the reconfigurable power converters 600, 650 may include a standardized power conversion device 605. The standardized power conversion device 605 may be mounted within an electronic package 210, 260, respectively, and may be a unitary semiconductor device. The standardized power conversion device 605 may be similar to the standardized power conversion device 205 illustrated in FIGS. 2A and 2B. The standardized power conversion device 605 may include two controllers 615a, 615b and five phases 620a-620e. Other implementations of the reconfigurable power converter may include any number of controllers and/or phases.

A reconfigurable capacitor 690 may be included within the electronic package 610, 660 with the standardized power conversion device 605. Similar to the implementations described in FIGS. 2A and 2B, a communications bus 625, 665 may couple each of controllers 615a, 615b to the phases 620a-620e. For example, as shown in FIGS. 6A and 6B, each controller 615a, 615b and each phase 620a-620e is configured with a communications line 630 that is accessible on the standardized power conversion device 605. Each electronic package 610, 260 may include circuitry that forms the dashed portions 635, 670 of each respective communications bus 625, 665.

Because electronic package 610, 660 forms a portion of communications bus 625, 665, a standardized power conversion device 605 can be used and reconfigured, via different electronic packages, for different applications by configuring the dashed portions 635, 670 of communications bus 625, 665 within each electronic package. Similarly, the reconfigurable capacitor 690 includes a plurality of capacitors 692 that can be coupled together using circuitry 695 of the electronics package 610, 660 to couple an appropriate number of capacitors together for each load.

Referring to FIG. 6A, the standardized power conversion device 605 may be utilized in power converter 600 to configure a one-phase and a four-phase power converter. The power converter 600 may include a first controller 615a coupled to first phase 620a and a second controller 615b coupled to the remaining four phases 620b-620e. The electrical connections 635 between the first controller 615a and the first phase 620a may be formed by electrical conductors, for example, but not limited to, printed circuit wiring, of the electronic package 610. Similarly, the electrical connections 635 between the second controller 615b and the remaining four phases 620b-620e may be formed by electrical conductors, for example, but not limited to, printed circuit wiring, of the electronic package 610.

In the implementation illustrated in FIG. 6A, two capacitors of the reconfigurable capacitor 690 may be coupled together for a first load and four capacitors of the reconfigurable capacitor 690 may be coupled together for second load. The electrical connections 695 between the first phase 620*a* and the two capacitors of the reconfigurable capacitor 690 may be formed by electrical conductors, for example, but not limited to, printed circuit wiring, of the electronic package 610. Similarly, the electrical connections 695 between the remaining four phases 620*b*-620*e* and the four capacitors of the reconfigurable capacitor 690 may be formed by electrical conductors, for example, but not limited to, printed circuit wiring, of the electronic package 610.

Referring to FIG. 6B, the standardized power conversion device 605 may be utilized in the power converter 650 to configure a two-phase and a three-phase power converter. The power converter 650 may include a first controller 615*a* coupled to two phases 620*a*-620*b* and a second controller 215*b* coupled to the remaining three phases 620*c*-620*e*. The electrical connections 670 between the first controller 615*a* and the two phases 620*a*-620*b* may be formed by electrical conductors, for example, but not limited to, printed circuit wiring, of the electronic package 660. Similarly, the electrical connections 670 between the second controller 615*b* and the remaining three phases 620*c*-620*e* may be formed by electrical conductors, for example, but not limited to, printed circuit wiring, of the electronic package 660.

As illustrated in FIGS. 6A and 6B, the different configurations of the power converter phases and capacitors may be accomplished by different wiring within the electronic package 610 as compared to the electronic package 660. Each electronic package 610, 660 can include electrical conductors that may be reconfigured as a portion of the communications buses 625, 665. In some implementations, the communications buses may be formed via hard wiring, programming of one or more components, multiplexing, a switch matrix, digital addressing or any other suitable structure. In some implementations, the reconfigurable capacitor bus may be formed via a multiplexing device, a series of discrete switches, or other suitable device. In other implementations, output inductors may be reconfigured via circuitry within the electronic package, a multiplexing device and/or discrete switches, or other suitable device.

Figure 7:
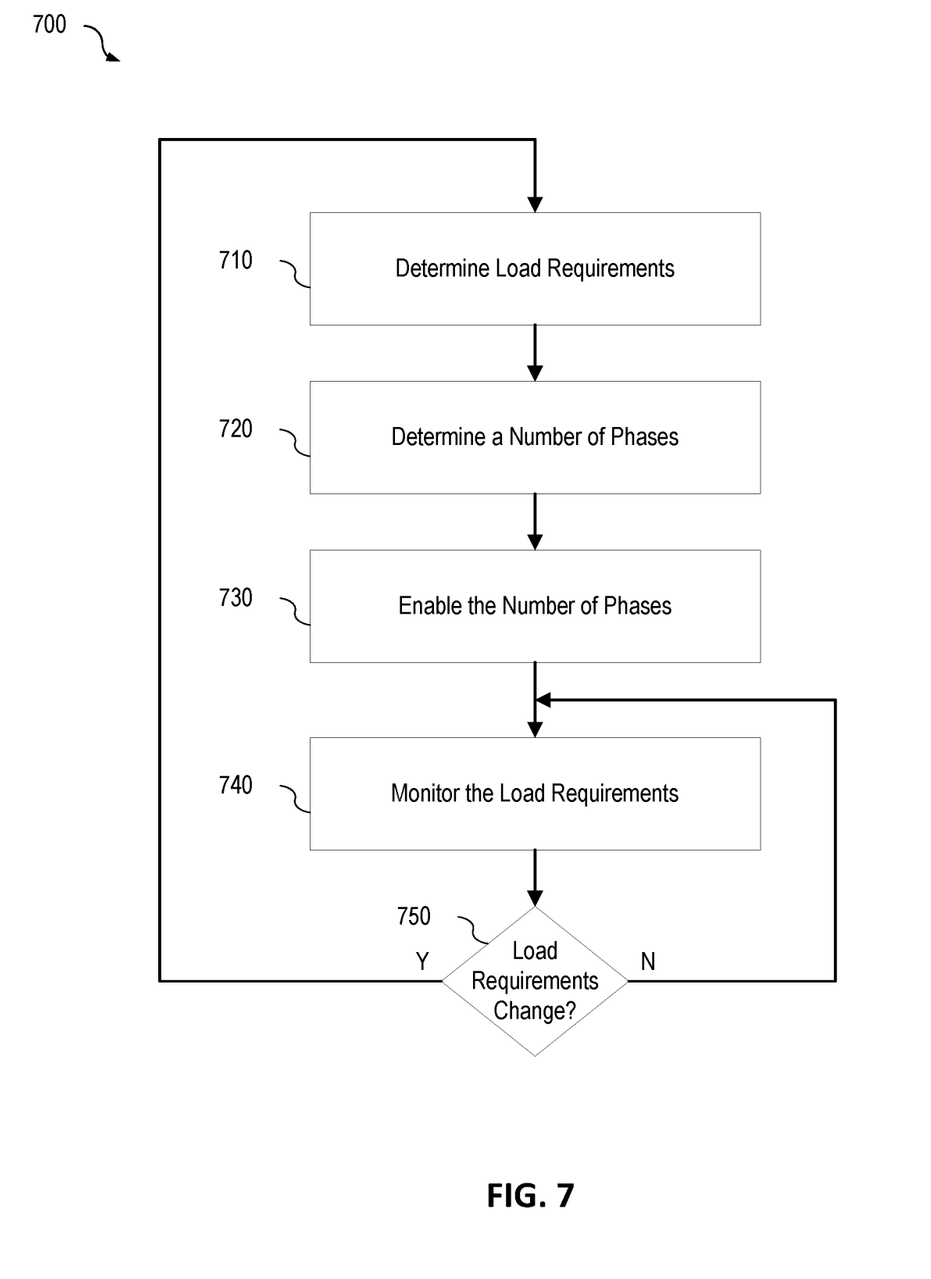
FIG. 7 is a flowchart illustrating an example of a method for controlling a power conversion integrated circuit (IC) device formed on a single semiconductor die according to some aspects of the present disclosure.

FIG. 7 is a flowchart illustrating an example of a method for controlling a power conversion integrated circuit (IC) device formed on a single semiconductor die according to some aspects of the present disclosure. Referring to FIG. 7, 700, at block 710, power delivered to the load by the power IC device may be determined. The controller may sense the power delivered to the load. For example, a feedback line coupled to the controller may sense delivered power. The controller may use the sensed load voltage to determine a state the load (e.g., a load voltage higher or lower than a specified voltage).

At block 720, a number of phases to enable may be determined. Based on the sensed load voltage, the controller may determine a number of phases to enable to meet the requirements of the load.

At block 730, the phases may be enabled. The controller may determine appropriate control signals and transmit the control signals to one or more phases to regulate power delivered to the load.

At block 740, the controller may continue to monitor the load requirements. The controller may sense the load requirements based, for example, signals from the feedback line, to determine whether the load requirements change. For example, changes in the feedback signal may indicate higher or lower loads on the power IC device.

At block 750, the controller may determine whether the load requirements have changed. For example, the power IC device may determine whether the load on the power IC device has increased or decreased. In response to determining that the load on the power IC device has not changed (750—N), the method may continue at block 740 to monitor the load requirements.

In response to determining that the load on the power IC device has changed (750-Y), the method may continue at block 720 to determine the number of phases to meet the load requirements.

The specific operations illustrated in FIG. 7 provide a particular method for controlling a power conversion integrated circuit (IC) device formed on a single semiconductor die according to an embodiment of the present disclosure. Other sequences of operations may also be performed according to alternative embodiments. For example, alternative embodiments of the present disclosure may perform the operations outlined above in a different order. Moreover, the individual operations illustrated in FIG. 8 may include multiple sub-operations that may be performed in various sequences as appropriate to the individual operation. Furthermore, additional operations may be added or removed depending on the particular applications.

Figure 8:
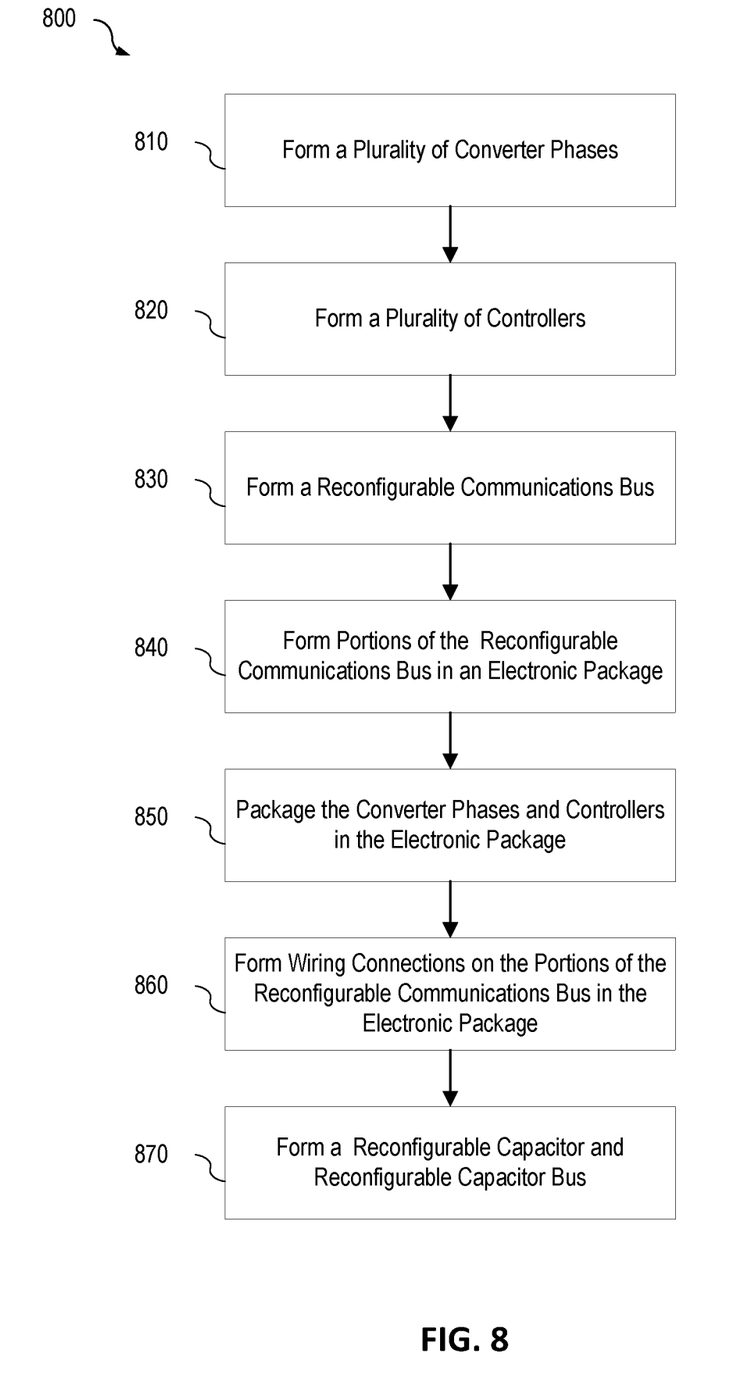
FIG. 8 is a flowchart illustrating an example of a method for making a configurable power converter according to some aspects of the present disclosure.

FIG. 8 is a flowchart illustrating an example of a method 800 for making a configurable power converter integrated circuit (IC) according to some aspects of the present disclosure. Referring to FIG. 8, at block 810, a plurality of converter phases may be formed. The converter phases may be semiconductor devices formed on a substrate by available semiconductor processes. Each phase may include, for example, but not limited to, one or more power switches (e.g., metal-oxide semiconductor field effect transistors (MOSFETs) or bipolar transistors), a pulse width modulator (PWM), as well as other circuitry.

At block 820, a plurality of controllers may be formed. The controllers may be semiconductor devices formed on a substrate by available semiconductor processes. The controllers may be formed on the same substrate as the converter phases or may be formed on a different substrate. Each of the controllers may be configured to control a specified number of converter phases.

At block 830, a communications bus may be formed. The communications bus may be used to form electrical connections between the converter phases and the controllers. Portions of the communications bus may be formed on the substrate(s) on which the controllers and converter phases are formed.

At block 840, portions of the communications bus may be formed in an electronic package. The electronic package may be, for example, but not limited to, a plastic ball-grid array (PBGA), quad flat no lead (QFN), small-outline integrated circuit (SOIC), chip-scale package (CSP), and a hybrid or variant thereof. The electronic package may include a package substrate on which portions of the communications bus are formed. For example, circuit traces configured to provide connections between the controllers and the converter phases may be formed on the package substrate.

At block 850, the plurality of converter phases and the plurality of controllers may be integrated in the electronic package. Each of the controllers and converter phases may be electrically and mechanically coupled to the substrate of the electronic package. In some implementations, output inductors for the converter phases may be integrated within the electronic package.

At block 860, wiring connections may be formed on the portions of the communications bus in the electronic package. Wiring connections may be formed on the portions of the communications bus in the electronic package to electrically couple the controllers to the converter phases. The wiring connections may couple each controller to a specified number of phases to provide a required amount of power to specified loads. The communications bus can enable s standardized power conversion device to be configured for a variety of applications having loads with different power requirements.

At block 870, a reconfigurable capacitor and reconfigurable capacitor bus may be formed. The reconfigurable capacitor and portions of the reconfigurable capacitor bus may be formed on a same substrate as the controllers and converter phases or on a different substrate. Other portions of the reconfigurable capacitor bus may be formed on the package substrate of the electronic package. The reconfigurable capacitor may include a plurality of individual capacitors that can be coupled together with the reconfigurable capacitor bus. Wiring connections may be formed on the portions of the reconfigurable capacitor bus in the electronic package to electrically couple the individual capacitors to the converter phases. In some implementations, the reconfigurable capacitor may alternatively or additionally reconfigured by wiring traces on the a PCB to which the electronic package is attached.

The specific operations illustrated in FIG. 8 provide a particular method for making a configurable power converter according to an embodiment of the present disclosure. Other sequences of operations may also be performed according to alternative embodiments. For example, alternative embodiments of the present disclosure may perform the operations outlined above in a different order. Moreover, the individual operations illustrated in FIG. 8 may include multiple sub-operations that may be performed in various sequences as appropriate to the individual operation. Furthermore, additional operations may be added or removed depending on the particular applications.

For simplicity, various peripheral electrical components and circuits are not shown in the figures.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. A power conversion device, comprising:
a semiconductor substrate;
first and second controller circuits formed on the semiconductor substrate;
a converter phase circuit formed on the semiconductor substrate; and
one or more programmable components formed on the semiconductor substrate that are programmable to couple the first controller circuit to the converter phase circuit in a first configuration such that the first controller circuit is arranged to regulate an output power of the converter phase circuit and to couple the second controller circuit to the converter phase circuit in a second configuration such that the second controller circuit is arranged to regulate the output power of the converter phase circuit; and
wherein the converter phase circuit comprises a selection switch arranged to couple the converter phase circuit to the first controller circuit in the first configuration or to the second controller circuit in the second configuration such that the converter phase circuit can be commanded by the first controller circuit or by the second controller circuit.

2. The power conversion device of claim 1, wherein at least one of the one or more programmable components is a portion of the first or second controller circuits.

3. The power conversion device of claim 1, wherein at least one of the one or more programmable components is a portion of the converter phase circuit.

4. The power conversion device of claim 1, wherein at least one of the one or more programmable components is positioned between the first controller circuit and the converter phase circuit.

5. The power conversion device of claim 1, further comprising an interconnect circuit formed on the semiconductor substrate and arranged to form one or more electrical connections between either of the first and second controller circuits and the converter phase circuit.

6. The power conversion device of claim 5, wherein the one or more programmable components configure the electrical connections formed by the interconnect circuit.

7. The power conversion device of claim 1, wherein the one or more programmable components comprise transistor-based switches.

8. The power conversion device of claim 1, wherein the one or more programmable components comprise a non-volatile memory.

9. The power conversion device of claim 1, wherein the one or more programmable components comprise digital circuitry.

10. The power conversion device of claim 1, wherein the one or more programmable components comprise a fuse.

11. The power conversion device of claim 1, wherein the one or more programmable components comprise an anti-fuse.

12. The power conversion device of claim 1, further comprising a configurable capacitor coupled to the converter phase circuit.

13. The power conversion device of claim 1, further comprising timing circuitry programmable to selectively trigger operation of the converter phase circuit at substantially regularly spaced time intervals.

14. A power conversion device, comprising:
a semiconductor substrate;
first and second controller circuits formed on the semiconductor substrate;
first and second converter phase circuits formed on the semiconductor substrate, wherein the first converter phase circuit comprises a first selection switch and the second converter phase circuit comprises a second selection switch; and a configurable circuit that couples the first controller circuit to the first and second converter phase circuits in a first configuration and couples the second controller circuit to the first converter phase circuit in a second configuration;

wherein the first and second selection switches are arranged to couple the first and second converter phase circuits to the first controller circuit; and wherein the first and second selection switches are arranged to couple the first and second converter phase circuits to the second controller circuit.

15. The power conversion device of claim 14, wherein the configurable circuit includes one or more programmable components.

16. The power conversion device of claim 15, wherein at least one of the one or more programmable components is a portion of the first or second controller circuits.

17. The power conversion device of claim 15, wherein at least one of the one or more programmable components is a portion of at least one of the first or second converter phase circuits.

18. The power conversion device of claim 15, wherein at least one of the one or more programmable components is positioned between the first controller circuit and the first converter phase circuit.

19. The power conversion device of claim 15, wherein the one or more programmable components comprise transistor-based switches.

20. The power conversion device of claim 15, wherein the one or more programmable components comprise a non-volatile memory.

21. The power conversion device of claim 15, wherein the one or more programmable components comprise digital circuitry.

22. The power conversion device of claim 15, wherein the one or more programmable components comprise a fuse.

23. The power conversion device of claim 15, wherein the one or more programmable components comprise an anti-fuse.

24. The power conversion device of claim 14, wherein the configurable circuit includes an interconnect circuit formed on the semiconductor substrate and arranged to form electrical connections between any of the first or second controller circuits and any of the first or second converter phase circuits.

25. The power conversion device of claim 24, wherein the configurable circuit includes one or more programmable components that configure the electrical connections formed by the interconnect circuit.

26. The power conversion device of claim 14, further comprising a configurable capacitor coupled to at least one of the first or second converter phase circuits.

27. The power conversion device of claim 14, wherein the configurable circuit includes an electrical conductor formed on the semiconductor substrate.

28. The power conversion device of claim 14, further comprising an electrical routing structure coupled to the semiconductor substrate, wherein the configurable circuit includes an electrical conductor formed in the electrical routing structure.

29. The power conversion device of claim 14, further comprising timing circuitry programmable to selectively trigger operation of at least one of the first or second converter phase circuits at substantially regularly spaced time intervals.

* * * * *